(12) United States Patent
Wu et al.

(10) Patent No.: US 7,491,646 B2
(45) Date of Patent: Feb. 17, 2009

(54) ELECTRICALLY CONDUCTIVE FEATURE FABRICATION PROCESS

(75) Inventors: Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 225 days.

(21) Appl. No.: 11/490,391

(22) Filed: Jul. 20, 2006

(65) Prior Publication Data

US 2008/0020572 A1    Jan. 24, 2008

(51) Int. Cl.
    H01L 21/44 (2006.01)
(52) U.S. Cl. ............... 438/686; 438/661; 257/E21.159; 257/E21.171
(58) Field of Classification Search ................. 438/686, 438/661, 650, 903; 437/98.3, 126.5, 229, 437/901; 257/E21.159, E21.171, E21.479, 257/E21.496, E21.497
    See application file for complete search history.

(56) References Cited

U.S. PATENT DOCUMENTS

| | | | |
|---|---|---|---|
| 3,702,259 A | 11/1972 | Nielsen | |
| 6,123,876 A * | 9/2000 | Kobayashi et al. | 252/519.2 |
| 6,197,366 B1 | 3/2001 | Takamatsu | |
| 6,951,666 B2 | 10/2005 | Kodas et al. | |
| 7,276,385 B1 * | 10/2007 | MacKenzie et al. | 438/4 |
| 2003/0068581 A1 * | 4/2003 | Kawamura et al. | 430/315 |
| 2004/0211979 A1 * | 10/2004 | Shioiri et al. | 257/199 |
| 2005/0127332 A1 * | 6/2005 | Nakagawa et al. | 252/500 |
| 2005/0129843 A1 | 6/2005 | Wu et al. | |
| 2005/0158528 A1 * | 7/2005 | Sasaki et al. | 428/209 |
| 2006/0073667 A1 | 4/2006 | Li et al. | |
| 2006/0110686 A1 * | 5/2006 | Park et al. | 430/315 |
| 2006/0130700 A1 | 6/2006 | Reinartz | |
| 2006/0254387 A1 * | 11/2006 | Lee et al. | 75/252 |

FOREIGN PATENT DOCUMENTS

EP    1 646 095 A2    4/2006
WO    WO 2004/085165 A1    10/2004

* cited by examiner

*Primary Examiner*—Caridad M Everhart
(74) *Attorney, Agent, or Firm*—Zosan Soong

(57) ABSTRACT

A process for fabricating an electrically conductive feature comprising: (a) liquid depositing a low viscosity composition comprising starting ingredients including an organic anine, a silver compound, and optionally an organic acid, to result in a deposited composition; and (b) heating the deposited composition, resulting in the electrically conductive feature comprising silver.

17 Claims, 2 Drawing Sheets

ELECTRICALLY CONDUCTIVE FEATURE FABRICATION PROCESS

STATEMENT REGARDING FEDERALLY SPONSORED RESEARCH OR DEVELOPMENT

This invention was made with U.S. Government support under Cooperative Agreement No. 70NANBOH3033 awarded by the National Institute of Standards and Technology (NIST). The U.S. Government has certain rights in the invention.

BACKGROUND OF THE INVENTION

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, etc. However the deposition and/or patterning of functional electrodes, pixel pads, and conductive traces, lines and tracks which meet the conductivity, processing, and cost requirements for practical applications have been a great challenge. Silver is of particular interest as conductive elements for electronic devices because silver is much lower in cost than gold and it possesses much better environmental stability than copper. There is therefore a critical need, addressed by embodiments of the present invention, for lower cost methods and composition that are suitable for fabricating electrically conductive feature or elements of electronic devices.

The following documents provide background information:

Takamatsu, U.S. Pat. No. 6,197,366 B1.
Kodas et al., U.S. Pat. No. 6,951,666 B2.
Yiliang Wu et al., Published U.S. patent application Ser. No. 20050129843A1 (corresponding to Attorney Docket No. A3401-US-NP).
Yuning Li et al., Published U.S. patent application Ser. No. 20060073667A1 (corresponding to Attorney Docket No. 20040823-US-NP).

SUMMARY OF THE DISCLOSURE

In embodiments there is provided a process for fabricating an electrically conductive feature comprising:

(a) liquid depositing a low viscosity composition comprising starting ingredients including an organic amine, a silver compound, and optionally an organic acid, to result in a deposited composition; and (b) heating the deposited composition, resulting in the electrically conductive feature comprising silver.

In further embodiments, there is provided a process comprising:

fabricating a thin film transistor comprising a semiconductor layer, a gate electrode; a source electrode in contact with the semiconductor layer; a drain electrode in contact with the semiconductor layer; and a gate dielectric disposed between the semiconductor layer and the gate electrode, wherein at least one electrode selected from the group consisting of the gate electrode, the source electrode, and the drain electrode is formed by an electrode fabrication process comprising: (i) liquid depositing a low viscosity composition comprising starting ingredients including an organic amine, a silver compound, and optionally an organic acid, to result in a deposited composition; and (ii) heating the deposited composition, resulting in the at least one electrode comprising silver.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
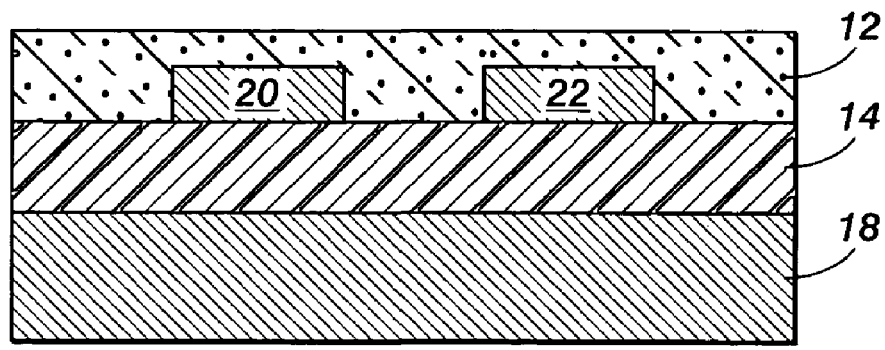
FIG. 1 represents a first embodiment of a TFT wherein at least one of the electrically conductive features is made using the present process.

It is understood that the term "silver" (in contrast to a silver compound) refers to silver atoms uncombined with other elements, that is, "elemental silver."

The term "low viscosity" in "low viscosity composition" refers to a viscosity suitable for liquid depositing such as for example less than about 1000 centipoise. In embodiments, the viscosity of the low viscosity composition is less than about 500 centipoise, or from about 5 centipoise to about 500 centipoise. In other embodiments, the viscosity of the low viscosity composition is less than about 100 centipoise. To determine whether a particular composition exhibits "low viscosity," the viscosity is determined prior to the liquid depositing using for example a rheology meter at a shear rate of from about 0.1 Hz to about 1000 Hz at room temperature.

The phrase "liquid depositing" refers to deposition of a low viscosity composition using a liquid process such as liquid coating or liquid printing, where the low viscosity composition is a solution or a dispersion. The low viscosity composition may be referred to as an ink when printing is used. Illustrative liquid coating processes include for example spin coating, blade coating, rod coating, dip coating, and the like. Illustrative liquid printing techniques include for example lithography or offset printing, gravure, flexography, screen printing, stencil printing, inkjet printing, stamping (such as microcontact printing), and the like. In embodiments, the liquid depositing is inkjet printing.

The "electrically conductive feature" produced by the present process has in embodiments a high conductivity. For example, thin-film conductivity of the electrically conductive feature is more than about 1000 Siemens/centimeter ("S/cm"), more than about 5000 S/cm, more than about 8,000 S/cm, and more than about 10,000 S/cm as measured by four-probe method. The electrically conductive feature can be used as conductive electrodes, conductive pads, conductive traces, conductive lines, conductive tracks, and the like in electronic devices. The phrase "electronic device" refers to macro-, micro- and nano-electronic devices such as thin film transistor, organic light emitting diodes, RFID tags, photovoltaic, and other electronic devices which require conductive elements or components. The electrically conductive feature has any suitable thickness for above applications. For example, the thickness is from about 5 nanometers to about 10 millimeters, from about 10 nanometers to about 5 millimeters, or from about 50 nm to about 1 millimeter. In embodiments, the electrically conductive feature has a low resistance for example less than about 1000 Ohm, less than about 10 Ohm, less than about 0.1 Ohm, or less than about 0.001 Ohm.

The low viscosity composition comprises starting ingredients including an organic amine, a silver compound, and optionally an organic acid. Chemical reactions/interactions may or may not occur which change the starting ingredients. For example, in embodiments, the organic amine may form a complex with the silver compound in the low viscosity composition.

Any suitable silver compound can be used. In embodiments, the silver compound is selected from the group consisting of silver acetate, silver carbonate, silver chlorate, silver chloride, silver lactate, silver nitrate, silver pertafluoropropionate, silver trifluoroacetate, silver trifluoromethanesulfonate, and a mixture thereof. In one embodiment, the silver compound is silver acetate.

Any suitable organic amine can be used. In embodiments, the organic amine is selected from the group consisting of ethanolamine, aminopropanol, diethanolamine, 2-methylaminoethanol, N,N-dimethylaminoethanol, methoxyethylamine, methoxypropylamine, diaminoethane, diaminopropane, diaminobutane, diaminocyclohexane, and a mixture thereof. In one embodiment, the organic amine is ethanolamine.

Any suitable organic acid can be used. In embodiments, the organic acid is a carboxylic acid containing for example at least 9 carbon atoms. In another embodiment, the organic acid is a carboxylic acid containing at least 10 carbon atoms. In embodiments, the organic acid is selected from the group consisting of nonanoic acid, decanoic acid, citronellic acid, geranic acid, undecenoic acid, lauric acid, myristic acid, palmitric acid, oleic acid, isomers thereof, and a mixture thereof. Isomers have the same number of atoms but different chemical structure or different arrangement of the atoms. For example, 2-butyloctanoic acid, which has 12 carbon atoms, is an isomeric form of lauric acid. In embodiments, the organic acid is an unsaturated carboxylic acid, for example, citronellic acid, geranic acid, undecenoic acid, and oleic acid. The addition of organic acid may confer a number of advantages in embodiments. First, the addition of organic acid may increase conductivity of the electrically conductive feature by a factor for example of about 2 to about 10. Second, when the electrically conductive feature is used as electrodes for electronic devices containing an organic semiconductor, the presence of the organic acid may dope the contact region between the electrode and the semiconductor to minimize contact resistance between the electrode and the semiconductor.

The low viscosity composition may be a solution or a dispersion. One, two, or more of the starting ingredients are the liquid medium for the solution/dispersion. In embodiments, the organic amine and/or the organic acid can be the liquid medium for the solution/dispersion. In embodiments, a starting ingredient other than the organic amine and the organic acid is the liquid medium for the solution/dispersion, where the liquid medium includes for instance a liquid selected from the group consisting of alcohol, ether, ester, water, aromatics, and a mixture thereof. In embodiments, the liquid is an alcohol selected from the group consisting of methanol, ethanol, propanol, butanol, ethyleneglycol, methoxyethanol, ethoxyethanol, methoxypropanol, ethoxypropanol, methoxybutanol, dimethoxyglycol, and a mixture thereof. In embodiments, the liquid medium may be considered as a solvent for one or more of the other starting ingredients such as the silver compound. In embodiments, more than two liquids are used at the same time. The addition of another liquid for example of ethyleneglycol and/or dimethoxyglycol may reduce the heating time to achieve the desired conductivities. The reduction of the heating time is for instance from about 50 percent to about 2 orders of magnitude.

The starting ingredients of the low viscosity composition can be present in any suitable molar ratio such as the following representative values. The molar ratio for organic amine to silver compound is for example from about 0.8 to about 2.5, or from about 1 to about 2. The molar ratio for organic acid to silver compound is for example from about 0.01 to about 1, or from about 0.02 to about 0.5. In embodiments, the silver compound in the low viscosity composition is from about 1 weight percent to about 50 weight percent, or from about 5 weight percent to about 30 weight percent. In the case of the presence of two more liquid media, any suitable ratio between or among the liquid media can be used.

The low viscosity composition can be formulated with any suitable method. In embodiments, the following procedure may be used. Organic amine is first dissolved in a suitable solvent for example an alcohol. Silver compound is added thereafter with agitation such as shaking or stirring. After that, organic acid is added to above mixture followed by agitation such as ultrasonic vibration or homogenization. Filtration is optional to remove any un-dissolved starting ingredients. In embodiments, the silver compound is dissolved in the low viscosity composition. The low viscosity composition is a solution.

In other embodiments, the low viscosity composition is a dispersion further containing for example metal particles such as silver nanoparticles, gold nanoparticles, and the like. The metal particles have a particle size from about 1 nanometer to about 999 nanometers, particularly from about 1 nanometer to about 100 nanometers.

In embodiments, the low viscosity composition can be very stable. In other words, the low viscosity composition can have a long shelf-life time when stored under ambient conditions. No or little precipitate is observed. In embodiments, the low viscosity composition has a shelf-life time more than 1 week, more than 1 month, more than 3 months, or more than 6 months. The shelf-life time is an important parameter for the fabrication of the electrically conductive feature via liquid deposition. Long shelf-life time is desirable to transfer and to deposit for example using ink jet printing the low viscosity composition without blocking the printing head. Longer shelf-life time may be achieved in embodiments using suitable liquid media such as for example alcohol and formamide. However, embodiments of the present invention also include a low viscosity composition with a short shelf-life time.

In embodiments, the deposited composition before heating is predominantly amorphous. To determine amorphous or crystalline state of the deposited composition, methods such as X-ray diffraction or polarized microscopy can be used. In embodiments, the amorphous deposited composition showed no birefringence under polarized microscopy or showed no diffraction peak in X-ray diffraction patterns.

In embodiments, the deposited composition before heating is substantially insulative with a thin film conductivity for example less than about $10^{-9}$ S/cm or less than about $10^{-10}$ S/cm.

Heating the deposited composition at any suitable temperature such as below about 250° C., or below about 200° C. or below about 150° C., causes the deposited composition to form an electrically conductive feature comprising silver, which is suitable for use as an electrically conductive element in electronic devices. The heating temperature preferably is one that does not cause adverse changes in the properties of previously deposited layer(s) or the substrate (whether single layer substrate or multilayer substrate). The heating is performed for a time ranging from for example about 1 second to about 10 hours, particularly from about 10 seconds to about 1 hour. The heating is performed in air, in an inert atmosphere for example under nitrogen or argon, or in a reducing atmosphere for example under nitrogen containing from about 1 to about 20 percent by volume hydrogen. The heating is performed under normal atmospheric conditions or at a reduced pressure of for example from several mbars to about $10^{-3}$ mbar. In embodiments, the heating can be accomplished for example in an instant heating manner at a certain temperature using a pre-heated heating equipment. In other embodiments, the heating can be accomplished in a gradual heating manner with a heating rate that the heating equipment can achieve, ranging from for example from about 0.5 to about 100° C. per minute starting from room temperature (about 20 to about 25° C.) or starting from a temperature between about 25° C. to about 100° C.

After heating, the film morphology of the electrically conductive feature can be characterized with any suitable technique such as for example Scanning Electron Microscopy (SEM). In embodiments, the electrically conductive feature is a continuous film with no cracks. In other embodiments, a few voids may be present. In embodiments, heating of the deposited composition causes the silver compound starting ingredient to change into silver having the form of fused nanoparticles. In embodiments, the electrically conductive feature comprises fused silver nanoparticles, wherein the nanoparticles have an estimated size ranging for example from about 10 nanometers to about 300 nanometers (although the nanoparticles are fused together, it may be possible to discern particle shape). In other embodiments, particle shape is not discernable in the silver.

In embodiments, the liquid depositing and the heating are each performed once or multiple times such as two, three or more times in any effective arrangement such as for example depositing+depositing+heating; and in another example, depositing+heating+depositing+heating. In embodiments where there are multiple occurrences of depositing and/or heating, such depositing and/or heating can be accomplished with the same or different low viscosity composition and under the same or different conditions (e.g., same or different heating profile). In embodiments, multiple occurrences of liquid depositing and heating may produce a thick electrically conductive feature that may be desirable for certain applications. In embodiments, multiple occurrences of liquid depositing and heating may also improve thin film conductivity of the electrically conductive feature by filling voids in the layer (s).

In embodiments, the low viscosity composition can be used in for example, but not limited to, fabricating conductive components such as source and drain electrodes in thin film transistor ("TFT").

In FIG. 1, there is schematically illustrated a TFT configuration 10 comprised of a heavily n-doped silicon wafer 18 which acts as both a substrate and a gate electrode, a thermally grown silicon oxide insulating layer 14 on top of which are deposited two metal contacts, source electrode 20 and drain electrode 22. Over and between the metal contacts 20 and 22 is an organic semiconductor layer 12.

Figure 2:
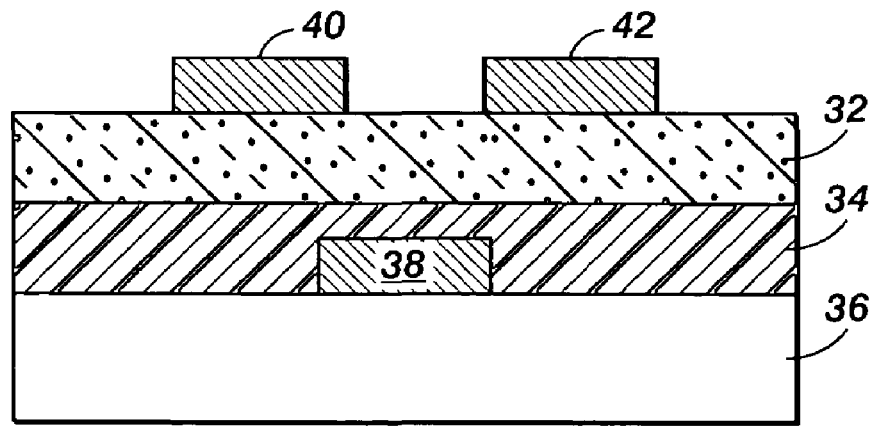
FIG. 2 represents a second embodiment of a TFT wherein at least one of the electrically conductive features is made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
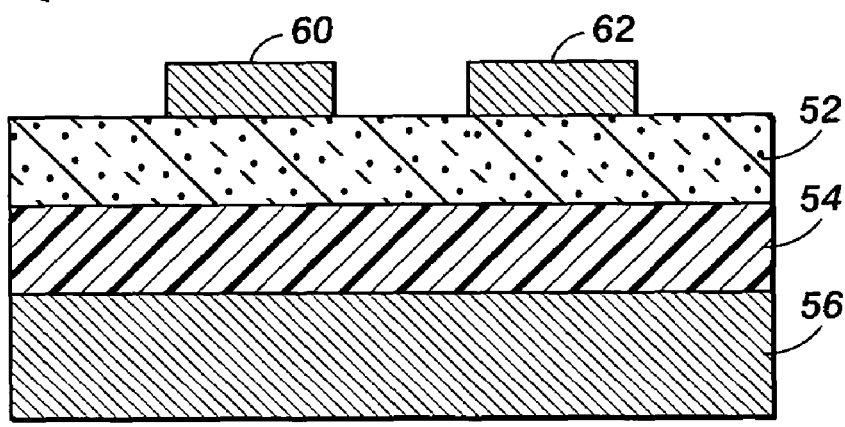
FIG. 3 represents a third embodiment of a TFT wherein at least one of the electrically conductive features is made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
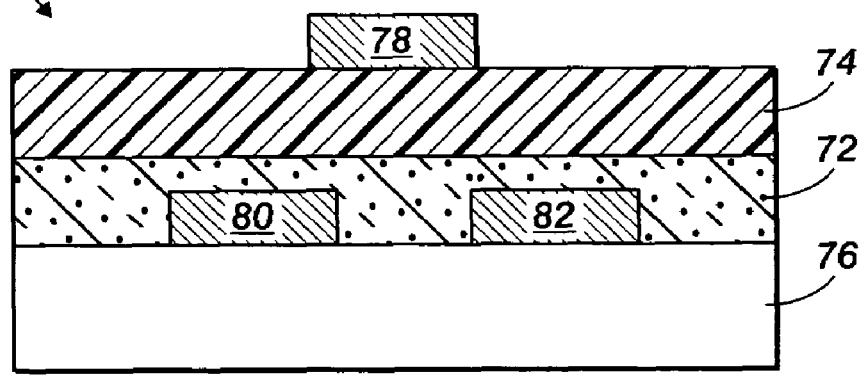
FIG. 4 represents a fourth embodiment of a TFT wherein at least one of the electrically conductive features is made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode may be fabricated by embodiments of the present invention. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in Beng Ong et al., U.S. Patent Application Publication No. U.S. 2003/0160230 A1; Beng Ong et al., U.S. Patent Application Publication No. U.S. 2003/0160234 A1; Beng Ong et al., U.S. Patent Application Publication No. U.S. 2003/0136958 A1; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by liquid deposition processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where. in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. Room temperature refers to a temperature ranging from about 20 to about 25 degrees C.

EXAMPLE 1

A low viscosity composition was prepared as follows: 1 g Ethanolamine was added into 5 g ethoxyethanol, followed by adding of 1 g silver acetate (AgAc) with shaking or stirring. After that, 0.1 g oleic acid was added to above mixture, followed by ultrasonic vibration to homogenously dissolve the acid. The viscosity of the composition was measured with rheology meter to be around 10 centipoise at the shear rate of 1 Hz at room temperature, which is suitable for inkjet printing. The resulting low viscosity composition was filtrated through a 0.45 μm syringe filter, then spin coated onto a clean glass slide at 1000 rpm for 30 s, and followed by heating on a hot plate under ambient atmosphere at 200 degree C. for 30 min. After cooled down to room temperature, thin film conductivity was measured with 4-probe technique to be $7-9 \times 10^3$ S/cm. The above composition was aged at room temperature overnight. Black precipitation was observed, indicating the composition has a short shelf-life time.

EXAMPLE 2

A composition similar to Example 1 was prepared except that n-butanol was used as solvent. After spin coating and heating at 200 degree C. for 30 min, the thin film conductivity was measured to be $1.3 \times 10^4$ S/cm. No precipitation was observed after the composition was aged at room temperature for 3 months, indicating an excellent shelf-life time.

EXAMPLE 3

1 g Ethanolamine was added into 5 g n-butanol, followed by addition of 1 g silver acetate (AgAc) with shaking or stirring. After filtrated through a 0.45 syringe filter, the composition was spin coated onto a clean glass slide at 1000 rpm for 30 s, and followed by heating on a hot plate under ambient atmosphere at 200 degree C. for 30 min. Thin film conductivity was measured to be $1-2 \times 10^3$ S/cm. Comparing example 3 to example 2, we can see that the addition of oleic acid increased conductivity by an order of magnitude.

EXAMPLE 4

The composition was prepared in example 2 was spin coated and heated at 200 degree C. for 10 min. The conductivity was measured to be <1000 S/cm.

EXAMPLE 5

A composition similar to Example 2 was prepared except for a 0.4 g ethylene glycol was added as a co-solvent. After filtrated, spin coated and heated at 200 degree C. for 10 min, the thin film conductivity was measured to be $1.6 \times 10^4$ S/cm. Comparing Example 5 with Example 4 and Example 2, we can see that the addition of co-solvent ethylene glycol increased conductivity slightly, but reduced heating time significantly.

EXAMPLE 6

1 g Ethanolamine was added into 5 g n-butanol, followed by adding of 1 g silver acetate (AgAc) with shaking or stirring. After that, 0.4 g ethylene glycol was added as co-solvent. Thereafter, 0.1 g various organic acids as list in the following table were added to above mixture, followed by ultrasonic vibration to homogenously dissolve the acid. The resulting compositions were filtrated and spin coated into thin film as above. Thin film conductivity was measured after heating at 200 degree C. for 30 min.

| Organic acid | Conductivity (S/cm) |
| --- | --- |
| Heptanoic acid | 1350 |
| Octanoic acid | 3540 |
| Nonanoic acid | 8940 |
| Decanoic acid | 14300 |
| Citronellic acid | 15000 |
| Geranic acid | 18000 |
| Undecenoic acid | 23200 |
| Lauric acid | 16900 |
| Myristic acid | 19600 |
| Palmitric acid | 16800 |
| Oleic acid | 18200 |

From above table we can see that the low viscosity composition containing organic acids with at least 9 carbon atoms exhibited high conductivity after heating. The isomeric forms (for example decanoic acid, citronellic acid, and geranic acid all have 10 carbon atoms) had little effect on conductivity.

EXAMPLE 7

1 g Ethanolamine was added into 5 g n-butanol, followed by adding of 1 g silver acetate (AgAc) with shaking or stirring. After that, 0.4 g ethylene glycol was added as co-solvent. Thereafter, 0.1 g lauric acid was added to above mixture, followed by ultrasonic vibration to homogenously dissolve the acid. The resulting composition was filtrated and spin coated into thin film as above. After heating at 150 degree C. for 45 min, thin film conductivity of the resulted silver film was measured to be $1.1 \times 10^4$ S/cm. This example indicates that the composition can be heated at a temperature as low as about 150 degree C. while retaining high conductivity.

EXAMPLE 8

X-ray diffraction was conducted on the heated thin films from Example 2 and Example 7. Both films gave diffraction patterns with d-spacing at 2.36, 2.04, 1.44, and 1.23 Å, which are identical to the diffraction pattern of vacuum evaporated pure silver film. This result indicated that the conductive film comprised silver.

EXAMPLE 9

SEM was conducted on the heated thin films from Example 2 and Example 7. Both films are continuous with no cracks. The films are composed of fused silver nanoparticles with particle size from about 50 nm to about 200 nm.

EXAMPLE 10

A bottom-contact TFT, as schematically shown by FIG. 1, was chosen to illustrate the use of silver precursor composition as the conductive electrodes of a thin-film transistor. The experimental device was fabricated under ambient conditions, and comprised of an n-doped silicon wafer with a thermally grown silicon oxide layer of a thickness of about 200 nm thereon. The wafer functioned as the gate electrode while the silicon oxide layer acted as the insulating layer and had a capacitance of about 15 nF/cm$^2$ (nanofarads/square centimeter), as measured using a capacitor meter. The silicon wafer was first cleaned with oxygen/argon plasma, isopropanol, air dried, and then immersed in a 0.1 M solution of octyltrichlorosilane in toluene for about 20 min at 60° C. Subsequently, the wafer was washed with toluene, isopropanol and air-dried.

The low viscosity composition of Example 2 was used to form source and drain electrodes as the following. The composition was spin coated onto above modified silicon wafer at 1000 rpm for 30 s. The resulted film was heated at 200 degree C. for 30 min to form continuous conductive silver film on the wafer. The continuous conductive silver film was subsequently patterned into parallel electrodes through mechanically scratching with a fine needle. This resulted in the formation of silver source and drain electrodes with a channel length of 24 micrometers and a channel width of 1430micrometers. Subsequently, a semiconductor layer was deposited on the electroded substrate using the polythiophene semiconductor of the following Formula:

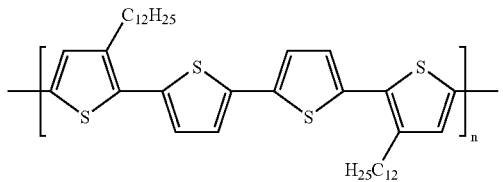

where n is the degree of polymerization and the polythiophene had a number average molecular weight of 17,300. This polythiophene and its preparation are described in Beng Ong et al., U.S. Patent Application Publication No. U.S. 2003/0160230 A1, the disclosure of which is totally incorporated herein by reference. The semiconductor polythiophene layer of about 30 nm to about 100 nm in thickness was deposited on top of the device by spin coating of the polythiophene in dichlorobenzene solution at a speed of 1,000 rpm for about 100 seconds, and dried in vacuo at 80° C. for 20 hr, followed by heating in a vacuum oven at 120-140° C. for 10-30 min to induce high structural orders of the semiconductor.

The evaluation of field-effect transistor performance was accomplished in a black box at ambient conditions using a Keithley 4200 SCS semiconductor characterization system. The carrier mobility, μ, was calculated from the data in the saturated regime (gate voltage, $V_G$<source-drain voltage, $V_{SD}$) accordingly to equation (1)

$$I_{SD}=C_i\mu(W/2L)(V_G-V_T)^2 \qquad (1)$$

where $I_{SD}$ is the drain current at the saturated regime, W and L are, respectively, the semiconductor channel width and length, $C_i$ is the capacitance per unit area of the insulating layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}=0$. An important property for the thin film transistor is its current on/off ratio, which is the ratio of the saturation source-drain current in accumulation regime over the current in depletion regime.

The inventive device prepared in this manner showed very good output and transfer characteristics. The output characteristics showed no noticeable contact resistance, very good saturation behaviour, clear saturation currents which are quadratic to the gate bias. The device turned on at around zero gate voltage with a sharp subthreshold slope. Mobility was calculated to be 0.07-0.1 cm$^2$/V.s, and the current on/off ratio was about 10$^7$. The performance of the inventive device was essentially the same as that of a conventional bottom-contact TFT with vacuum deposited silver electrodes.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process for fabricating an electrically conductive feature comprising:
   (a) liquid depositing a low viscosity composition comprising starting ingredients including an organic amine, a silver compound, and a carboxylic acid with at least 9 carbon atoms, to result in a deposited composition; and
   (b) heating the deposited composition,
   resulting in the electrically conductive feature comprising silver.

2. The process of claim 1, wherein the organic amine is selected from the group consisting of ethanolamine, aminopropanol, diethanolamine, 2-methylaminoethanol, N,N-dimethylaminoethanol, methoxyethylamine, methoxypropylamine, diaminoethane, diaminopropane, diaminobutane, diaminocyclohexane, and a mixture thereof.

3. The process of claim 1, wherein the organic amine is ethanolamine, the silver compound is silver acetate, and the carboxylic acid has at least 10 carbon atoms.

4. The process of claim 1, wherein the carboxylic acid is selected from the group consisting of nonanoic acid, decanoic acid, citronellic acid, geranic acid, undecenoic acid, lauric acid, myristic acid, palmitric acid, oleic acid, isomers thereof, and a mixture thereof.

5. The process of claim 1, wherein the liquid depositing is accomplished by liquid printing.

6. The process of claim 1, wherein the low viscosity composition has a viscosity ranging from about 5 to about 500 centipoise.

7. The process of claim 1, wherein the silver compound is selected from the group consisting of silver acetate, silver carbonate, silver chlorate, silver chloride, silver lactate, silver nitrate, silver pertafluoropropionate, silver trifluoroacetate, silver trifluoromethanesulfonate, and a mixture thereof.

8. The process of claim 1, wherein the silver compound is silver acetate, the organic acid is a carboxylic acid with at least 10 carbon atoms, and the starting ingredients further include an alcohol.

9. The process of claim 1, wherein the heating is performed at a temperature lower than about 250 degree C.

10. The process of claim 1, wherein the heating is performed at a temperature lower than about 200 degree C.

11. The process of claim 1, wherein the electrically conductive feature has a thin-film conductivity greater than about 5,000 S/cm.

12. The process of claim 1, wherein the electrically conductive feature has a thin-film conductivity greater than about 10,000 S/cm.

13. The process of claim 1, wherein the low viscosity composition is a solution.

14. The process of claim 1, wherein the starting ingredients further include a Liquid selected from the group consisting of alcohol, ether, ester, water, aromatics, and a mixture thereof.

15. The process of claim 14, wherein the alcohol is selected from the group consisting of methanol, ethanol, propanol, butanol, ethyleneglycol, methoxyethanol, ethoxyethanol, methoxypropanol, ethoxypropanol, methoxybutanol, dimethoxyglycol, and a mixture thereof.

16. A process comprising:

fabricating a thin film transistor comprising a semiconductor layer, a gate electrode; a source electrode in contact with the semiconductor layer; a drain electrode in contact with the semiconductor layer; and a gate dielectric disposed between the semiconductor layer and the gate electrode, wherein at least one electrode selected from the group consisting of the gate electrode, the source electrode, and the drain electrode is formed by an electrode fabrication process comprising: (i) liquid depositing a low viscosity composition comprising starting ingredients including an organic amine, a silver compound, and an organic acid wherein the organic acid is a carboxylic acid with at least 9 carbon atoms, to result in a deposited composition; and (ii) heating the deposited composition, resulting in the at least one electrode comprising silver.

17. The process of claim 16, wherein the organic amine is ethanolamine, the silver compound is silver acetate, and the carboxylic acid has at least 10 carbon atoms.

* * * * *

UNITED STATES PATENT AND TRADEMARK OFFICE
CERTIFICATE OF CORRECTION

PATENT NO. : 7,491,646 B2
APPLICATION NO. : 11/490391
DATED : February 17, 2009
INVENTOR(S) : Yiliang Wu et al.

It is certified that error appears in the above-identified patent and that said Letters Patent is hereby corrected as shown below:

In the Specification:

Column 1, line 8, after "Cooperative Agreement No.", please delete "70NANBOH3033" and insert --70NANB0H3033--.

Signed and Sealed this
Tenth Day of September, 2013

Teresa Stanek Rea
*Acting Director of the United States Patent and Trademark Office*